(12) United States Patent
Geffken et al.

(10) Patent No.: US 6,426,249 B1
(45) Date of Patent: Jul. 30, 2002

(54) BURIED METAL DUAL DAMASCENE PLATE CAPACITOR

(75) Inventors: Robert M. Geffken, Burlington; Anthony K. Stamper, Williston, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/526,354

(22) Filed: Mar. 16, 2000

(51) Int. Cl.[7] .......................................... H01L 21/8242
(52) U.S. Cl. ..................... 438/239; 438/622; 438/329; 438/393; 438/399
(58) Field of Search ................................ 438/106, 121, 438/239, 329, 393, 396, 397, 399, 250, 253, FOR 430, 118, 622, 533, 623, 624, 626, 631, 633

(56) References Cited

U.S. PATENT DOCUMENTS

| 5,162,258 A | 11/1992 | Lemnios et al. ............ 437/184 |
| 5,219,787 A | 6/1993 | Carey et al. ................. 437/187 |
| 5,708,559 A | 1/1998 | Brabazon et al. ............ 361/313 |
| 5,753,948 A | 5/1998 | Nguyen et al. .............. 257/307 |
| 5,780,333 A | * 7/1998 | Kim .............................. 438/238 |
| 5,926,359 A | * 7/1999 | Greco et al. ................. 361/311 |
| 6,008,083 A | 12/1999 | Brabazon et al. ............ 438/239 |
| 6,110,772 A | * 8/2000 | Takada et al. ............... 438/238 |
| 6,204,111 B1 | * 3/2001 | Uemoto et al. ............. 438/239 |
| 6,204,116 B1 | * 3/2001 | Pang ........................... 438/253 |
| 6,262,446 B1 | * 7/2001 | Koo et al. .................... 257/296 |

* cited by examiner

Primary Examiner—Tom Thomas
Assistant Examiner—Douglas L. Owens
(74) Attorney, Agent, or Firm—Downs Rachlin Martin PLLC

(57) ABSTRACT

A metal capacitor formed as part of metal dual damascene process in the BEOL, of a wafer. A lower plate (27) of the capacitor is sandwiched between an insulating layer (25) and a dielectric layer (29). The insulating layer on an opposite side abuts a layer of metalization (23, 24) and the dielectric layer separates the lower plate of the capacitor from an upper plate (59) of the capacitor. A portion (27A) of the lower plate projects into a via (37) adjacent to it that is filled with copper (63). The via projects up to a common surface with the upper plate but is electrically isolated form the upper plate. The via also extends down to the layer of metalization.

15 Claims, 11 Drawing Sheets

BURIED METAL DUAL DAMASCENE PLATE CAPACITOR

FIELD OF INVENTION

The present invention relates to fabrication of a capacitor in the layers of metalization on a semiconductor wafer and, more specifically, to a metal capacitor made as part of a copper dual damascene process during fabrication of the layers of metalization on a semiconductor wafer.

BACKGROUND OF THE INVENTION

As front end of the line (FEOL) components of a chip have become progressively smaller, more numerous, more complex and faster, the number of back end of the line (BEOL) layers has increased. Because of the size and density of the FEOL devices, the width, and hence the cross sectional areas, of the interconnect lines in the BEOL layers has been reduced. However, reducing such cross sectional area raises the resistance of the aluminum interconnect lines heretofore used. Thus, recently there has been a movement to using copper in the BEOL structures because of its lower resistance qualities. Use of copper has required the adoption of a whole new fabrication technology based on copper dual damascene manufacturing techniques.

In the past decoupling capacitors for semiconductor chips have been placed in the packaging. However, given the high frequency at which semiconductor chips now operate, the long conduction paths for decoupling capacitors when placed in the packaging is often not acceptable. The migration from an aluminum reactive ion etch process for interconnections on BEOL layers of a semiconductor chip to copper dual damascene interconnection, along with the need to reduce conduction path length for decoupling capacitors, provides a need for new chip level integrated decoupling capacitor structures and methods of fabricating them.

SUMMARY OF THE INVENTION

It is an objective of the present invention to provide a method and device for fabricating a metal capacitor within the layers of metal on a semiconductor chip.

It is another objective of the present invention to provide a method of fabricating a metal capacitor on a chip as part of a copper dual damascene manufacturing process.

It is yet another objective to provide a method of fabricating a precision metal capacitor on a semiconductor chip as part of a copper dual damascene manufacturing process.

These and other objectives are meet by providing a method of forming a metal capacitor on a wafer having devices fabricated up through at least one level of metal. The method comprises the steps of depositing an insulating layer, forming a first metal plate on the insulating layer and then providing a dielectric material on top of the first metal plate. Next, a via is formed extending through the dielectric material and contacting the first metal plate. Finally, metal is deposited in the via and on top of the first insulating material so as to form a second metal plate.

In another aspect of the present invention it provides a capacitor fabricated within metalization layers of a semiconductor wafer. The capacitor includes an insulating layer and a first plate, made from an electrically conductive material, positioned on a first side of the insulating layer. The first plate has a shoulder. In addition, the capacitor has a dielectric material covering the first plate except for the shoulder and a via that projects down past the dielectric material and includes the shoulder of the first plate. A metal stud is positioned in the via which so as to contact the shoulder. A second plate is positioned adjacent the dielectric material so that the dielectric material is positioned between the first plate and the second plate.

DETAILED DESCRIPTION OF THE INVENTION

The present invention is a buried metal capacitor made in the layers of metalization during a BEOL dual damascene fabrication process.

FIGS. 1A–1F show one method of fabricating the capacitor of the present invention. The capacitor is fabricated in a metal layer on a semiconductor chip 19, a portion of such chip being depicted in FIG. 1A. Typically, chip 19 has devices fabricated up through at least a first metal layer 21. Metal layer 21 has an insulating layer 22 in which metal interconnects 23 and 24 are embedded and passivated. A first insulating layer 25, e.g., SiO$_2$, fluorinated SiO$_2$(FSG), polyarelene ethers (PAE), aerogels, hydrogen silsesquoixane (HSQ), methyl silsesquoixane (MSQ) or similar material is formed on first metal layer 21. Preferably, first insulating layer 25 is made from a low K (e.g., preferably less than 3.0) dielectric constant insulator. A metal plate 27, which will serve as the buried metal plate of a capacitor, is formed using conventional deposition and etching steps. Plate 27 can be tungsten, or similar refractory metal, which is compatible with adjacent materials and has good conductivity. In addition, plate 27 should be made from a material that during the various fabrication steps, will not experience grain growth or movement that would disrupt the capacitor insulator on top of it. A dielectric layer 29 is deposited on first metal layer 21 and plate 27. In this embodiment of the invention, dielectric layer 29 will, as explained below, serve as an etch stop and as the capacitor dielectric. Dielectric layer 29 is made from silicon nitride (SiN$_x$ H$_y$), silicon carbide (SiC$_x$ H$_y$), silicon dioxide (SiO$_2$) or other similar materials. Preferably dielectric layer 29 is a high relative K (e.g., greater. than 5) dielectric constant insulator.

Figure 1A:
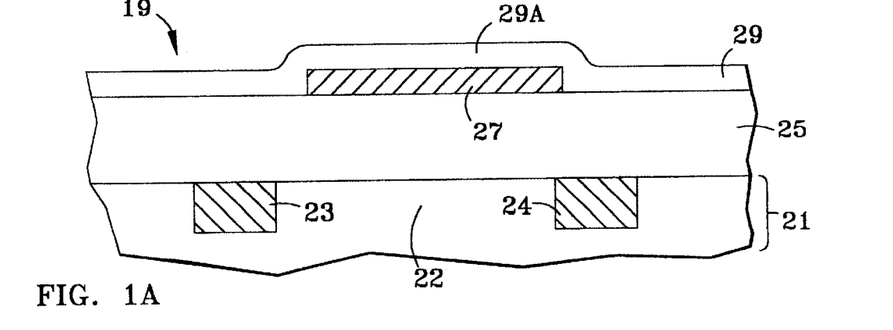
FIGS. 1A–1F are cross-sectional schematic representations of the steps of one method of fabricating a metal capacitor in a layer of metalization on a semiconductor wafer as part a dual damascene manufacturing process.
Figure 1B:
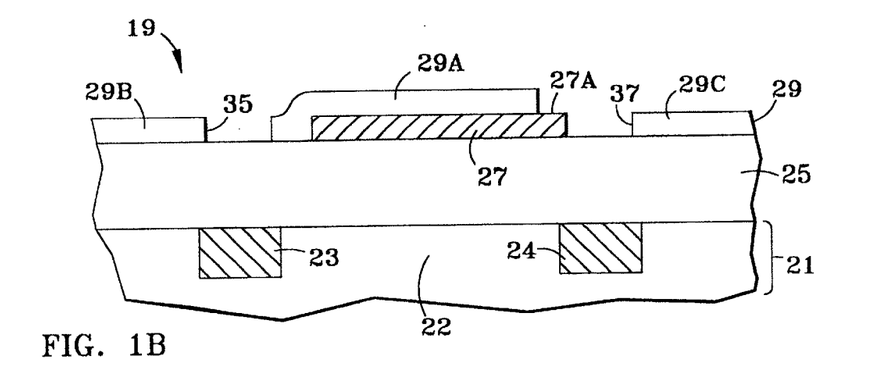

Referring to FIG. 1B, in the next step vias 35 and 37 are formed to provide contact to first metal layer 21 directly above interconnects 23 and 24, respectively. Vias 35 and 37 are formed by depositing a photoresist, photo-patterning with a mask to prepare for the formation of vias 35 and 37, forming vias 35 and 37 by etching and then removing the photoresist. Since the technique of depositing a photoresist, photo patterning with a mask, etching and removing the photoresist is well known, a complete description and illustration of the entire process for forming a via or trench will not be given each time the process is discussed. As described in more detail below, via 37 is formed for the purpose of receiving a metal (e.g., tungsten or copper) stud connecting the underlying metal interconnect 24 and the buried metal plate 27. In this regard, via 37 is formed so that a portion 29A of dielectric layer 29 is removed above lower plate 27 so as to expose shoulder 27A. Via 35 receives a typical vertical interconnect or stud between metal layer 21 and upper metal layers.

Figure 1C:
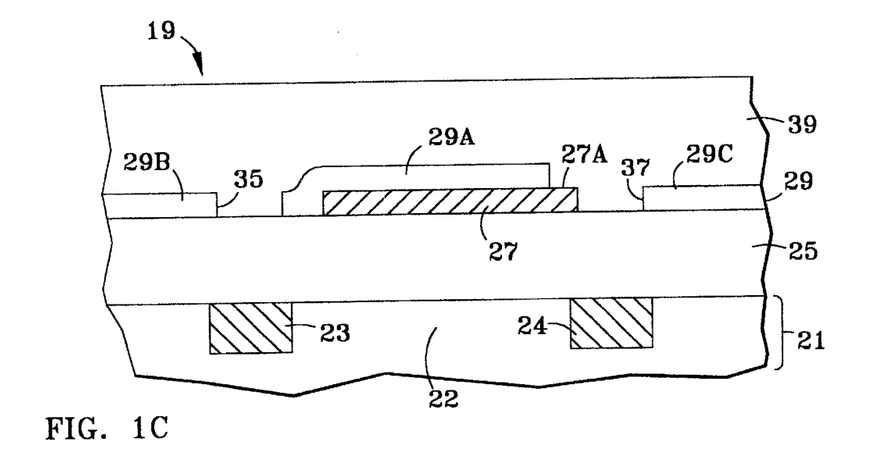

Referring to FIG. 1C, next a second insulating layer 39, of the same or a different material as first insulating layer 25, is deposited on dielectric layer 29 and in vias 35 and 37. Layer 39 should also preferably be a low relative K material (e.g., a K less than 3.0).

Figure 1D:
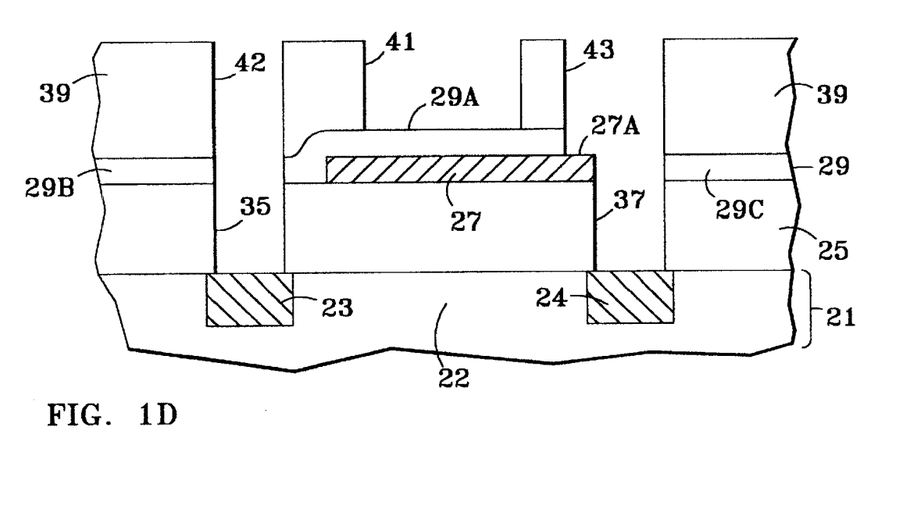

Referring to FIG. 1D, next trenches 41, 42 and 43 are formed in insulating layer 39 by appropriate photo patterning. In the same step vias 35 and 37 are extended down through insulating layer 25 to metal interconnects 23 and 24, respectively. Dielectric layer 29 at portion 29A acts as an etch stop halting the etching of the trench 41. Since vias 35 and 37 were formed in dielectric layer 29 in the prior etching step illustrated in FIG. 1B, etching continues in both vias 35 an 37 down to metal interconnects 23 and 24. Trenches 42 and 43 may be wider than vias 35 and 37, and are usually not perfectly aligned with the vias as shown in FIG. 1D.

The etching step illustrated in FIG. 1D must be highly selective such that it does not degrade portion 29A, which will serve as the capacitor dielectric. The attributes of the etching process used to form trenches 41, 42 and 43 and extend vias 35 and 37 to metal layer 21 are such that it effectively etches the insulators 39 and 25 but does not have much of an etch effect on tungsten plate 27 or dielectric layer 29. In this regard, when dielectric layer 29 is made of silicon nitride or a similar material, suitable etching for the step illustrated in FIG. 1D may be accomplished using conventional perfluorocarbon (PFC) or hydrofluorocarbon (HFC) etches.

Figure 1E:
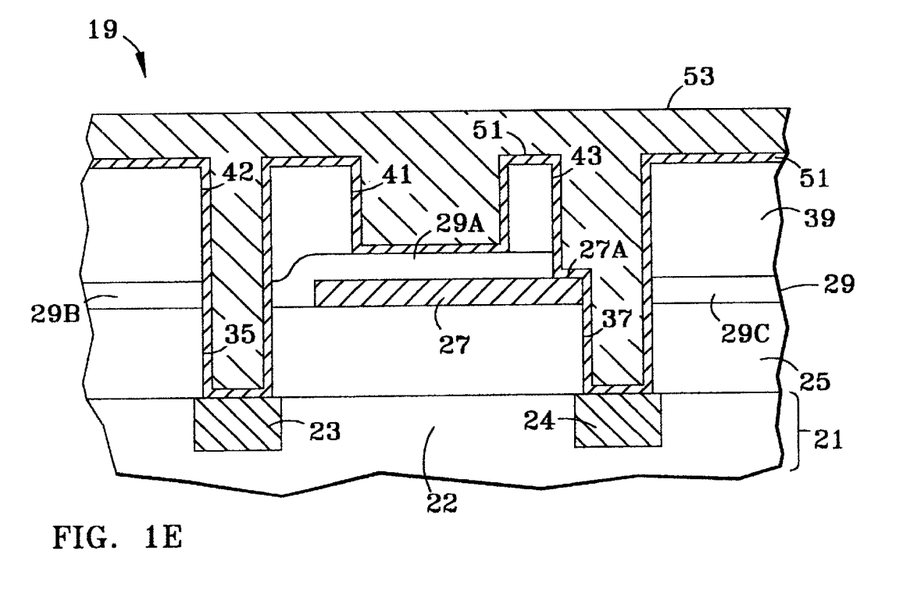

As depicted in FIG. 1E, the next step is depositing barrier layer 51 on top of insulating layer 39, in vias 35 and 37 and in trenches 41, 42 and 43. In the preferred embodiment, barrier layer 51 may be made of one or more of Ta, TaN, WN, TiN, TaSiN, TiSiN and a sputtered copper seed layer. In general, any combination of refractory metals, refractory metal silicides and/or refractory metal nitrides could be used for barrier layer 51. Barrier layer 51 encapsulates the structure formed up to this point so that it is isolated from the copper which will be electroplated in the last step. The thin seed layer of copper is designed to create a surface upon which the copper will nucleate. In some cases, it may not be necessary to include the seed layer in barrier layer 51. Copper layer 53 is then electroplated onto barrier layer 51.

Figure 1F:
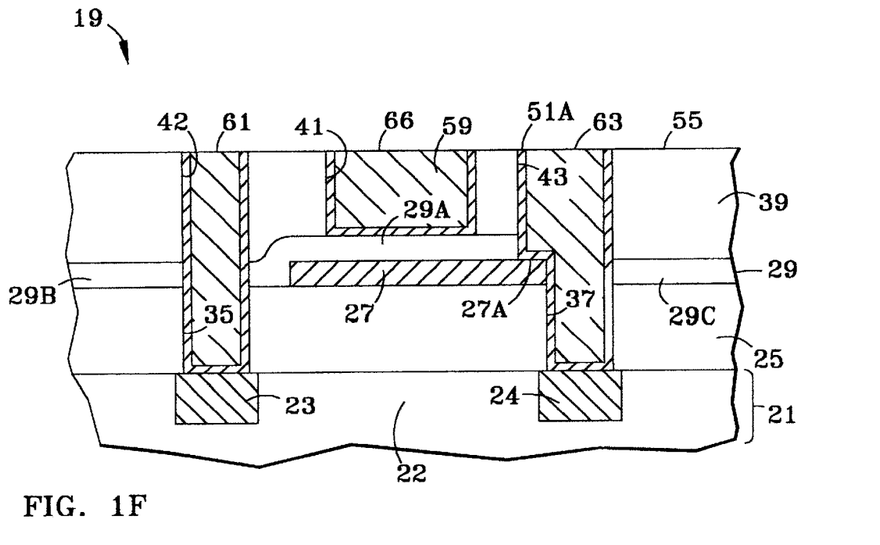

In the final step of fabrication of the capacitor structure, illustrated in FIG. 1F, copper layer 53 is removed down to surface 55 by a planarizing step, which in the preferred embodiment is a conventional chemical-mechical polish (CMP). step. The planarization step removes the excess copper down to level 55 of insulating layer 39. This effectively isolates upper plate 59 in trench 41 from copper studs 61 and 63. Upper plate 59 forms the top plate of the capacitive structure. While it is perferred that layer 53 be made from copper, the present invention is not so limited. Thus, aluminum, aluminum/copper alloys, and other metals may be used for layer 53. When layer 53 is not made from copper, it is not typically necessary to provide. a sputtered seed layer as part of barrier layer 51.

Thus, the completed basic capacitive structure appears in FIG. 1F, and includes bottom plate 27, top plate 59 and dielectric layer 29A positioned between them. Insulating layer 25 and dielectric layer 29A almost completely surround bottom plate 27, isolating it from any electrical contact with plate 59. Shoulder 27A is the only portion of plate 27 exposed as it projects into via 37. Shoulder and edge 27A make electrical contact with stud 63 in via 37. Layer 51A is that portion of barrier layer 51 deposited prior to electroplating copper layer 53, and is itself a conducting layer. Thus, the capacitive structure depicted in FIG. 1F is ready for interconnection to the rest of the circuitry on the wafer. Surface 66 of plate 59 provides the contact for the upper plate 59 and stud 63 in via 37 provides the contact for lower plate 27.

Figure 1G:
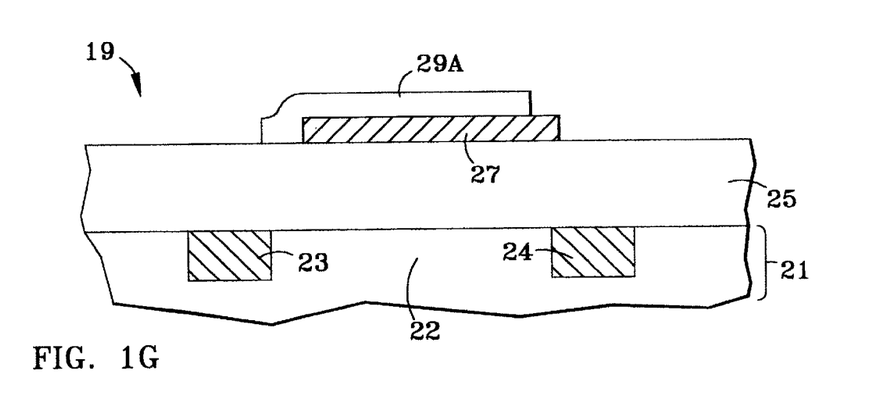
FIG. 1G depicts an additional step which when included in the method of fabrication depicted in FIGS. 1A–1F provides a second useful alternative method.

Inclusion of an additional step in the previously described fabrication process provides a useful variation in the method of making the capacitive structure described above. This second embodiment of the invention is achieved by adding a second mask and etch step to pattern capacitor dielectric 29 prior to forming second insulating layer 39. Referring to FIG. 1B, the second mask and etch step removes portions 29B and 29C of dielectric layer 29. FIG. 1G depicts the wafer after this mask and etch step but before second insulating layer 39 is applied. Since capacitor dielectric 29 is preferably a high dielectric constant material, this variation reduces line to line capacitance between interconnects.

Figure 2A:
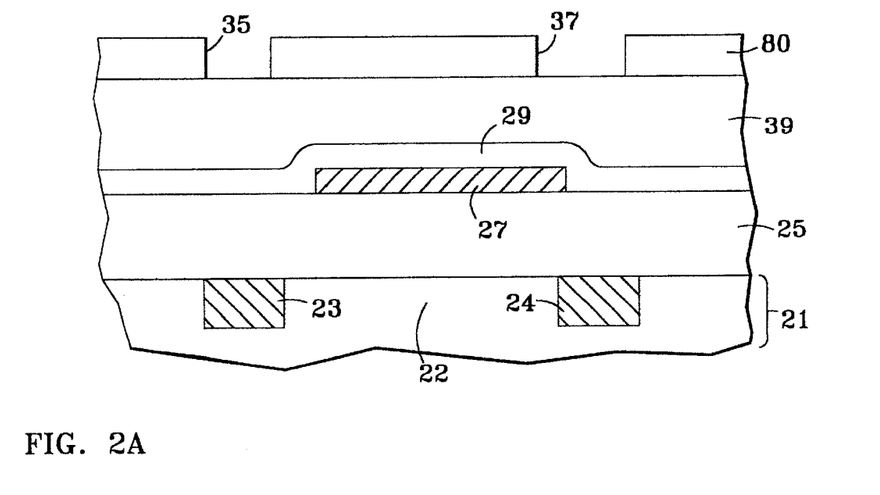
FIGS. 2A and 2B are cross-sectional schematic representations of the initial steps of another method of fabricating a metal capacitor that is a variation of the method shown in FIGS. 1A–1F.
Figure 2B:
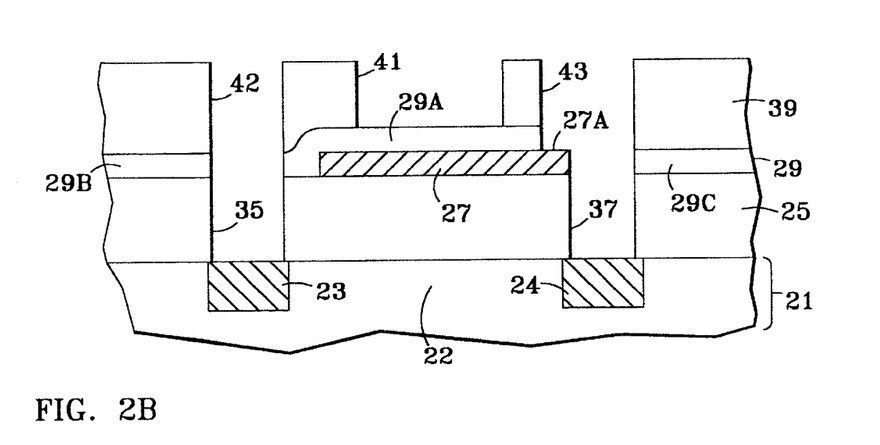

An alternative to the via first integration scheme depicted in FIGS. 1A–1F is illustrated in FIGS. 2A and 2B. In this embodiment, after lower plate 27 is fabricated and dielectric layer 29 and insulating layer 39 are deposited, photoresist layer 80 is provided on the insulating layer 39. Then, photoresist layer 80 is photo-patterned to form vias 35 and 37, as illustrated in FIG. 2A.

Referring to FIG. 2B, vias 35 and 37 are then etched down through insulating layer 39, dielectric layer 29, and first insulating layer 25 to interconnects 23 and 24, respectively, as described above relative to FIG. 1D. Thus, vias 35 and 37 are formed all the way to interconnects 23 and 24 with a single mask. Next, another photoresist layer (not shown) is applied and photo-patterned to form trenches 41, 42 and 43, thereby creating the same structure as shown in FIG. 1d. Thereafter, chip 19 is completed following the process steps described above and illustrated in FIGS. 1E and 1F.

Figure 3A:
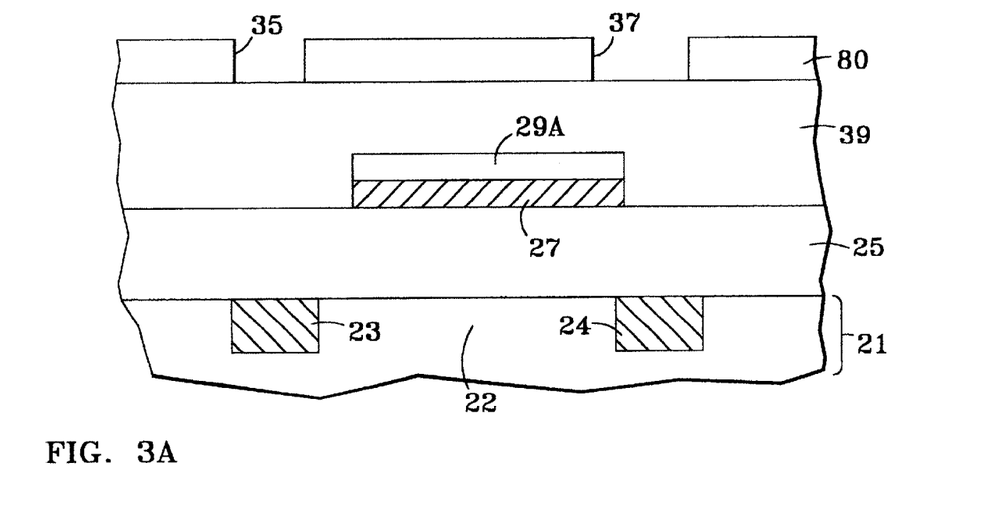
FIGS. 3A and 3B are cross-sectional schematic representations of the initial steps of yet another method of fabricating a metal capacitor that is a variation of the method shown in FIGS. 1A–1F.
Figure 3B:
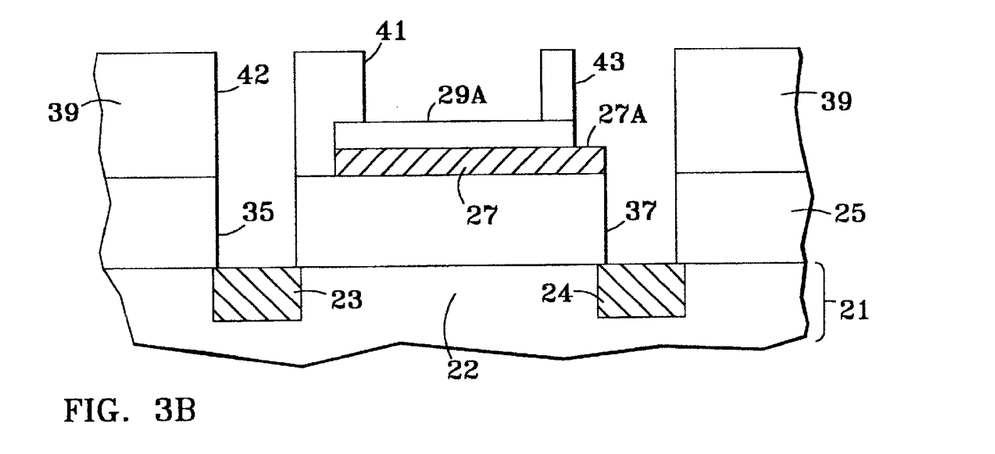

While the capacitor structures formed in accordance with the processes illustrated in FIGS. 1A–1F and 2A and 2B function quite effectively and are readily manufacturable, the possibility exists for more capacitance and cross-talk between metal lines in semiconductor chip 19 than may be desirable. This occurs due to the relatively high dielectric constant of dielectric layer 29 and its position between metal lines in semiconductor chip 19. The embodiment of the present invention illustrated in FIGS. 3A and 3B is designed to overcome this potential disadvantage.

In this embodiment, a metal layer (not shown) that forms lower plate 27 and dielectric layer 29 are deposited. Then a layer of photoresist (not shown) is applied, patterned using a single mask and etched so as to form a metal/dielectric stack as illustrated in FIG. 3A. After stripping the photoresist, insulating layer 39 is deposited. Then photoresist layer 80 is deposited on insulating layer 39 and is patterned to form vias 35 and 37, as illustrated in FIG. 3A. Vias 35 and 37 are then etched down to interconnects 23 and 24, as described above with respect to FIG. 2B. Trenches 41, 42 and 43 are then formed in insulating layer 39, as shown in FIG. 3B and described above relative to FIG. 2B. Finally, semiconductor chip 19 is completed as described above and illustrated in FIGS. 1E and 1F.

Figure 4A:
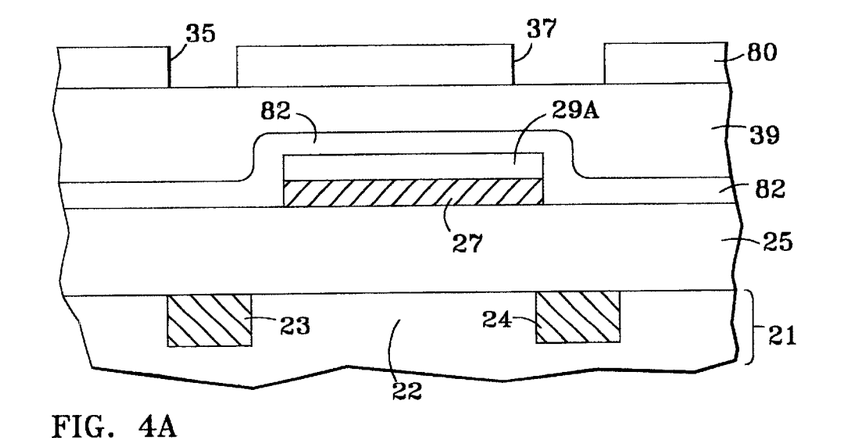
FIGS. 4A and 4B are cross-sectional schematic representations of the initial steps of still another method of fabricating a metal capacitor that is a variation of the method shown in FIGS. 1A–1F.
Figure 4B:
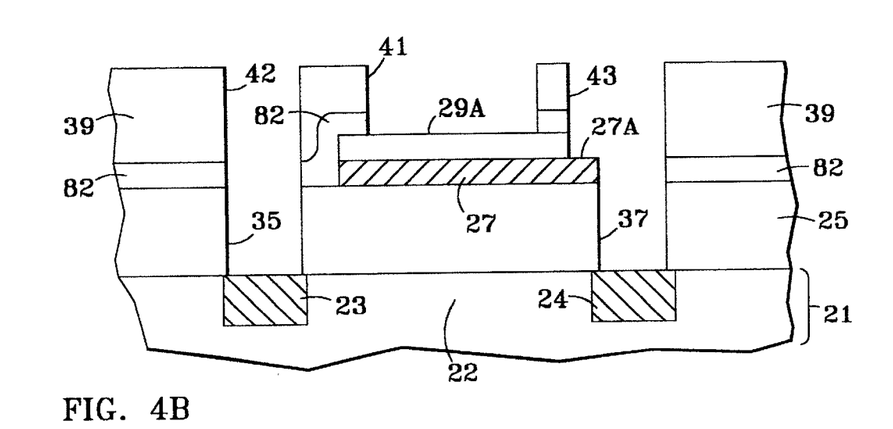

Still another variation of the method illustrated in FIGS. 1A–1F is shown in FIGS. 4A and 4B. This method is similar to the one shown in FIGS. 3A and 3B in that lower plate 27 and dielectric layer 29 are patterned with a single mask. As such, there is no high K dielectric between wiring lines. However, this embodiment differs from the embodiment shown in FIGS. 3A and 3B in that a low K dielectric etch stop layer 82 is deposited on first insulating layer 25 and lower plate 27/dielectric layer 29 stack. Suitable materials for etch stop layer 82 include $SiC_xH_y$ and $SiO_x$, which are typically deposited to a thickness of about 20–50 nm. Thereafter insulating layer 39 is deposited on etch stop layer 82, and is patterned to form vias 35 and 37 and trenches 41, 42 and 43 as described above. Formation of trenches 41, 42 and 43 includes removal of etch stop layer 82 within the trench, as shown in FIG. 4B. Then following the process steps described above with regard to FIGS. 1A–1F, fabrication of chip 19 is completed.

An advantage of providing etch stop layer 82 is that the depth of metal wire structures (not shown) formed in insulating layer 39 in subsequent process steps can be precisely controlled. This occurs by stopping formation of trenches in insulating layer 39 in which the wire structures will be formed on etch stop layer 82. Control of trench depth, and hence wire structure thickness, avoids or significantly reduces capacitive coupling between wiring that might arise from wire structures of varying thickness.

Figure 5A:
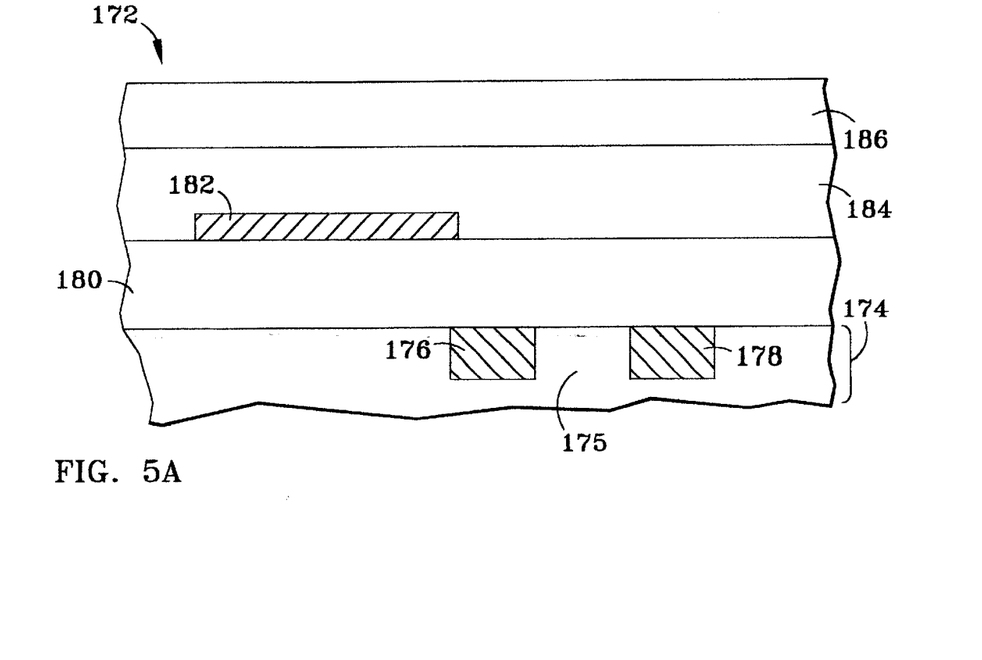
FIGS. 5A–5I are representative of yet another method of fabricating a metal capacitor in a layer of metalization on a semiconductor wafer as part a dual damascene manufacturing process.

FIGS. 5A–5I depict yet another embodiment of the present method for fabricating essentially the same capacitive structure as appears in FIG. 1F. FIG. 5A provides a cross-sectional view of a small portion of a semiconductor chip 172 having devices fabricated up through at least a first metal layer 174. Typically, layer 174 has an insulating layer 175 in which metal interconnects 176 and 178 are formed. The first step is depositing an insulating layer 180 and then patterning a metal plate 182, generally of tungsten or other materials suitable for plate 27 as discussed above. The materials used for insulating layer 25 may be used for insulating layer 180. Next a second insulating layer 184 of the same or different material as insulating layer 180 is deposited onto chip 172. Finally, a photoresist layer 186 is applied.

Figure 5B:
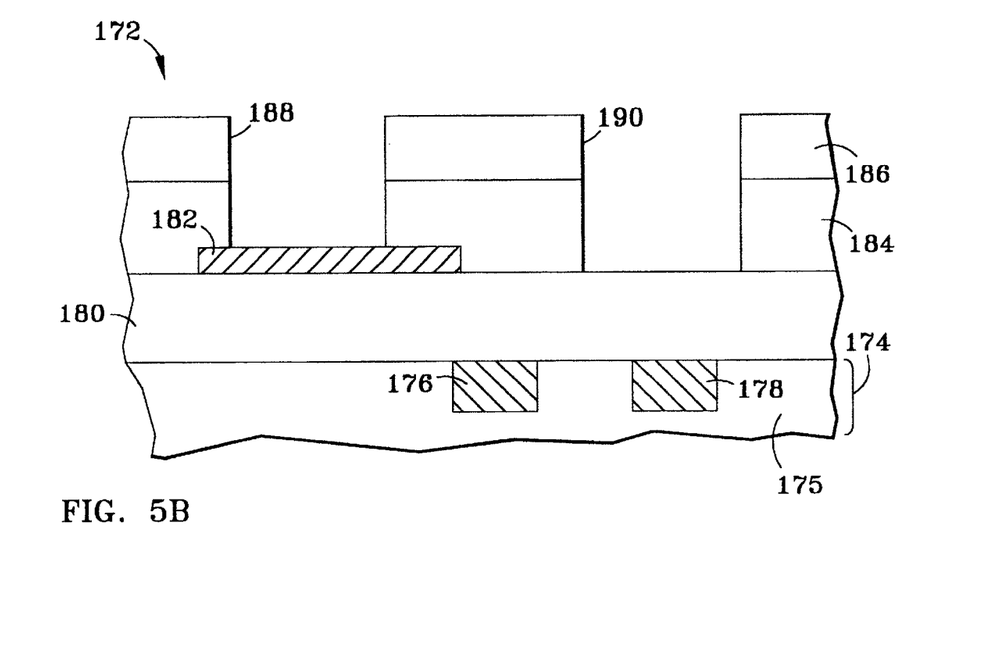
Figure 5C:
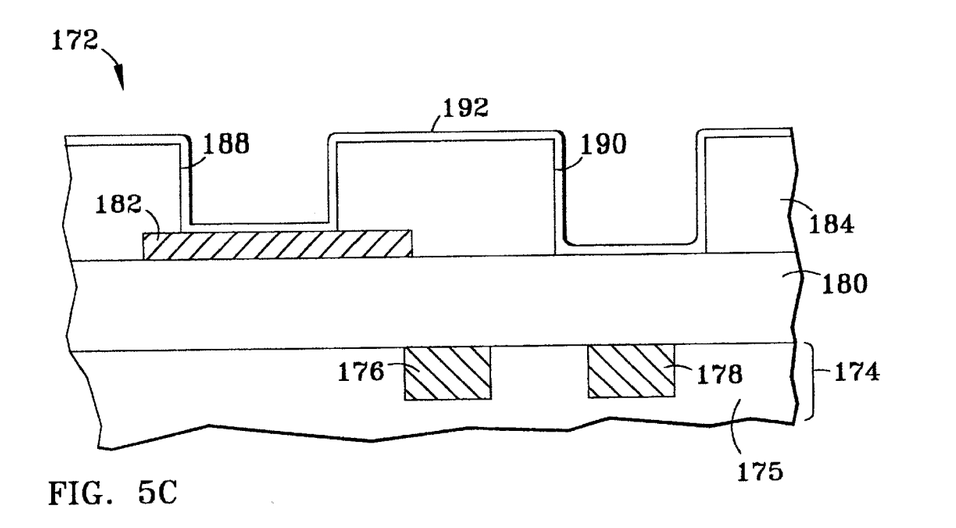

Referring to FIG. 5B, photo patterning is conducted to create capacitor trench 188 and metal line trench 190 in insulating layer 184. Then, photoresist layer 186 is removed.

Next, a thin layer 192 of a high dielectric constant material (FIG. 5C) is deposited on insulating layer 184 and exposed portions of metal plate 182. Materials of the type used for layer 29 may be used for layer 192.

Figure 5D:
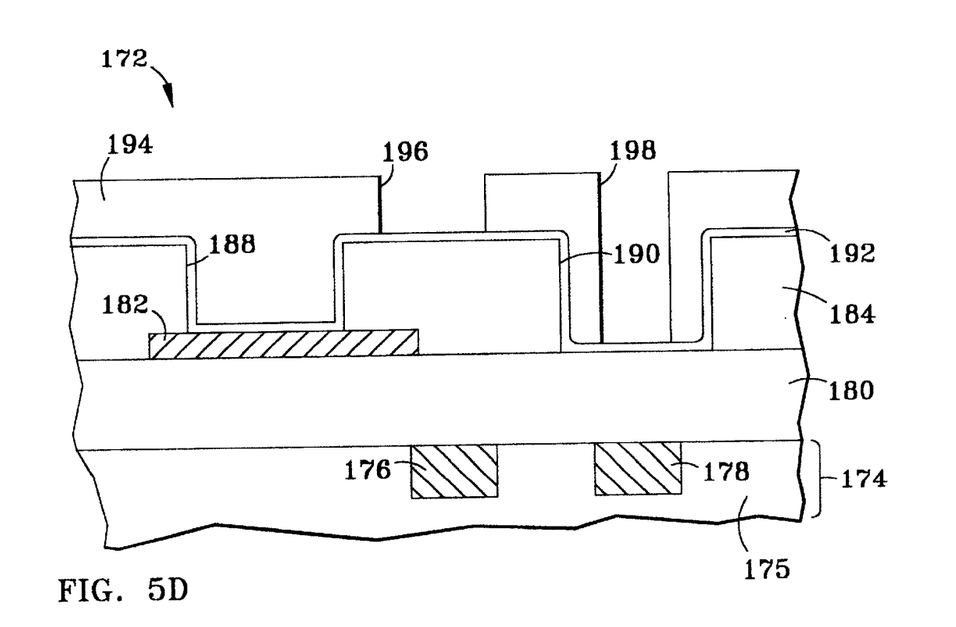
Figure 5E:
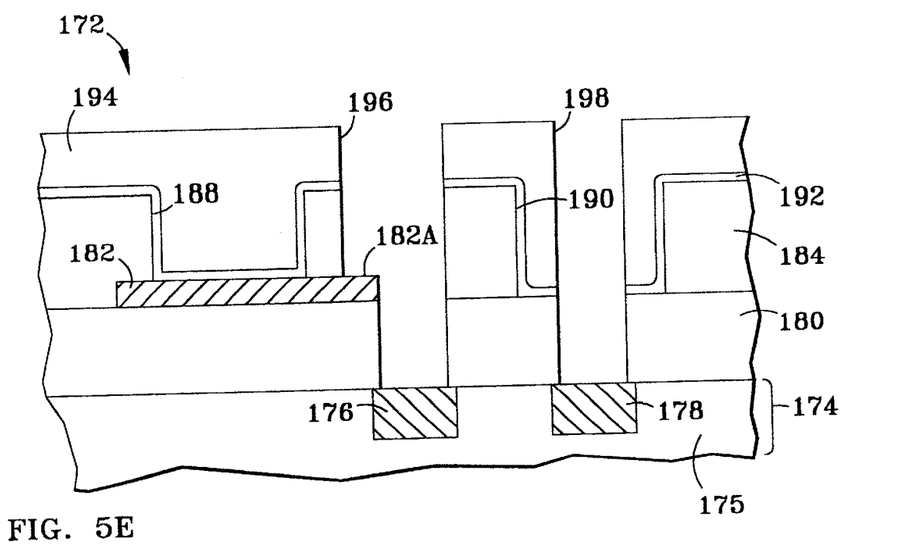
Figure 5F:
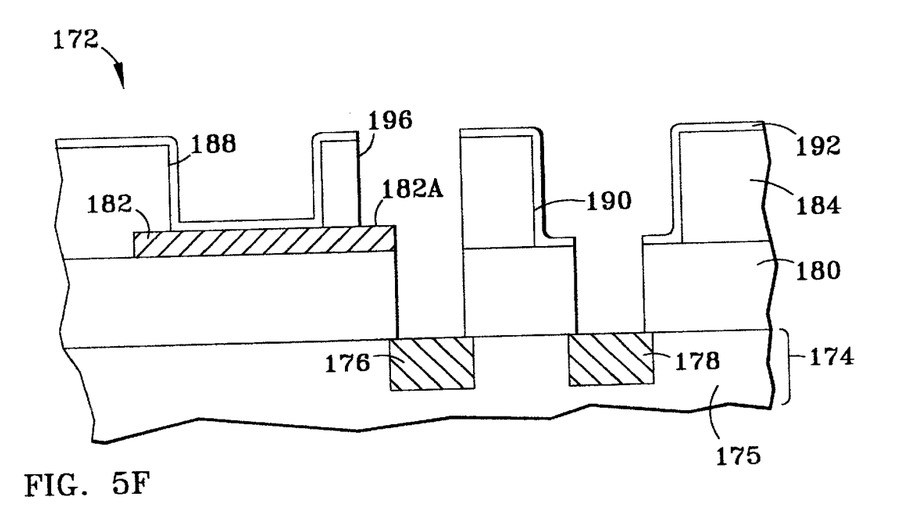
Figure 5G:
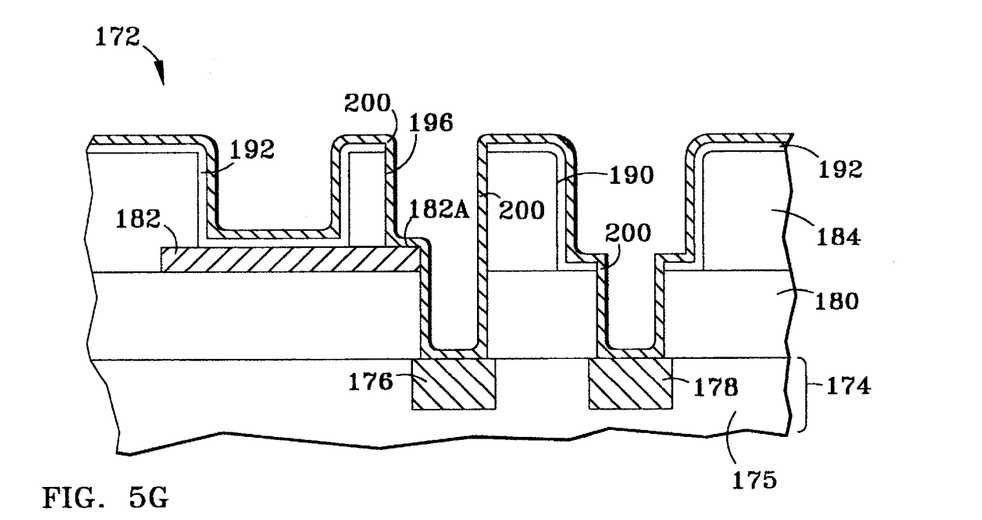

As illustrated in FIG. 5D, a second photoresist layer 194 is deposited. Photoresist layer 194 is then patterned to create vias 196 and 198, which stop on dielectric layer 192. Next, as shown in FIG. 5E, vias 196 and 198 are extended through the high K dielectric layer 192 and insulating layer 180 so that the vias stop on interconnects 176 and 178. Via 196 is sized so as to expose shoulder 182A of metal plate 182. Then photoresist layer 194 is removed to arrive at the structure depicted in FIG. 5F.

Figure 5H:
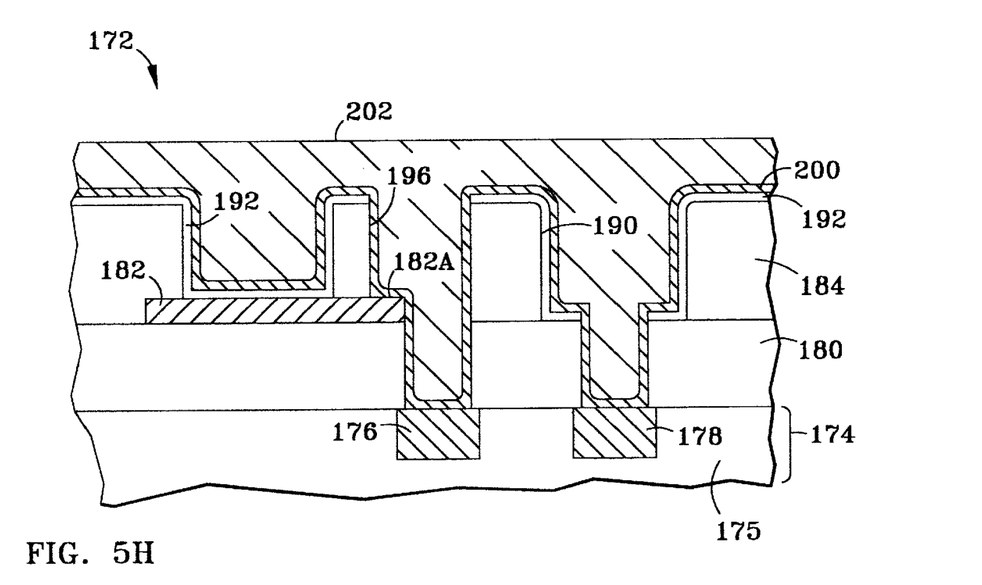

Next, barrier layer 200 (FIG. 5G) is deposited onto dielectric layer 192 and on the surfaces defining vias 196 and 198. Barrier layer 200 is made from the same materials as barrier layer 51, as discussed above, e.g., a thin layer of TaN, and a thin sputtered copper seed layer. In the next step, copper layer 202 is electroplated in a thick layer on barrier layer 200 (FIG. 5H). As noted above, layer 202 may be made from a material other than copper, in which case barrier layer 200 typically will not include a sputtered copper seed layer.

Figure 5I:
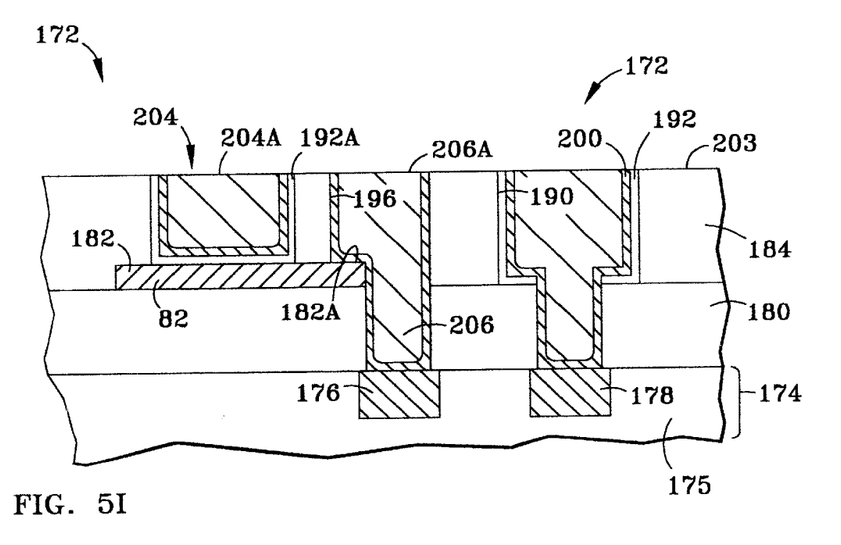

As depicted in FIG. 5I chip 172 is then planarized using a chemical-mechanical polish or similar method to remove the excess metal from the surface of chip 172, and to remove upper, horizontally extending portions of barrier layer 200 and dielectric layer so as to stop at surface 203. This process leaves the finished capacitor with its lower plate 182, dielectric layer 192A and upper plate 204. Shoulder 182A of the lower capacitor plate 182 makes an electrical contact with stud 206, i.e., the metal in via 196. Thus, the capacitor is ready for connection with the rest of the circuitry of chip 172. Contact with upper plate 204 is made on the top surface 204A of the plate, and contact with the lower plate 182 is made at the top surface 206A of stud 206 in via 196.

The present invention is ideally adapated for use in a copper dual damascene fabrication process. However, all damascene metal structures described above, e.g., interconnects 23 or metal layer 53, may be made from any suitable metal, not just copper. When copper is not used, it may be desirable to modify the composition of the underlying barrier layers, e.g., barrier layer 51, including omitting the copper seed layer.

While the present invention has been described in connection with a preferred embodiment, it will be understood that it is not so limited. On the contrary, it is intended to cover all alternatives, modifications and equivalents as may be included within the spirit and scope of the invention as defined in the appended claims.

What is claimed is:

1. A method for forming a metal capacitor on a wafer having devices fabricated up through at least one level of metal, the method comprising the steps of:
   a. providing a first insulating layer;
   b. forming a first metal plate on top of said first insulating layer;
   c. providing a dielectric material on top of said first metal plate;
   d. forming a via extending through said dielectric material and contacting said first metal plate; and
   e. depositing metal in said via and on top of said dielectric material so as to form a second metal plate.

2. A method according to claim 1, wherein said step e comprises the following steps:
   a. forming a second insulating layer on said dielectric material;
   b. forming a capacitor trench in said second insulating layer so that said dielectric material remains between said trench and said first metal plate;
   c. forming a via trench in said second insulating layer and said dielectric material that contacts said metal plate; and
   d. forming said second metal plate.

3. A method according to claim 1, wherein said steps d and e comprise the following steps:
   a. forming a second insulating layer on said dielectric material;
   b. forming said via through said second insulating layer and said dielectric material so as to contact said first metal plate;

c. forming a trench in said second insulating layer above said first metal plate so that said dielectric material remains between said trench and said first metal plate; and d. forming said second metal plate in said trench.

4. A method according to claim 1, wherein said steps d and e comprise the following steps:

a. providing a first photoresist layer;

b. photo-patterning with a mask a via in said first photoresist layer;

c. extending said via down through said dielectric material to contact said first metal plate;

d. removing excess photoresist;

e. providing a second insulating layer;

f. providing a second a photoresist layer;

g. forming in said second insulating layer a trench and said via, wherein said dielectric material acts as an etch stop for said trench; and h. removing excess photoresist.

5. A method according to claim 1, wherein said depositing step e comprises the steps of:

a. providing a barrier layer on said dielectric material and in said via, wherein said barrier layer prevents migration of copper;

b. depositing a seed layer of copper on said barrier layer;

c. electroplating a layer of copper over said seed layer of copper; and d. planarizing said wafer process to remove excess portions of said electroplated layer of copper, said barrier layer and said seed layer of copper.

6. A method according to claim 1, further comprising the step of removing portions of said dielectric material before performing said steps d and e.

7. A method according to claim 1, wherein said steps c–e comprise the following steps:

a. forming a second insulating layer on said first insulating layer and said first metal plate;

b. depositing a photoresist layer;

c. photo-patterning said photo resist layer to remove said second insulating layer above said first plate;

d. etching said wafer to remove said photoresist layer and said second insulating layer above said first plate and thereby form a capacitor plate trench;

e. removing said first photoresist layer remaining;

f. depositing a thin high dielectric constant material;

g. depositing a second photoresist layer;

h. photo-patterning at least one via in said second photoresist layer;

i. forming said via through said photo patterned portions of said photoresist layer, said thin high dielectric constant material and through said second insulating layer so said via contacts said first metal plate; and j. removing portions of said second photoresist layer remaining.

8. A method according to claim 7, wherein step h involves etching said via through said high dielectric constant material, through said second insulating layer so said via contacts said first metal plate and through said first insulating layer to the at least one level of metal.

9. A method according to claim 1, wherein said step c comprises depositing a dielectric material having a relative dielectric constant that is greater than 5.

10. A method according to claim 1, wherein said step a comprises depositing an insulating material selected from a group consisting of $SiO_2$, fluorinated $SiO_2$ (FSG), polyarelene ethers (PAE) and aerogels, hydrogen silsesquoixane (HSQ), methyl silsesquoixane (MSQ) and $SiO_xC_yH_z$.

11. A method according to claim 1, wherein said step b comprises forming a first plate made of tungsten.

12. A method according to claim 1, wherein said step d comprises the following steps:

i. providing a second insulating layer on said dielectric material; and ii. forming said via through said second insulating layer, said dielectric material and said first insulating layer so as to contact said first metal plate, using a single mask.

13. A method according to claim 1, wherein said steps b and c comprise the following steps:

i. depositing a layer of metal;

ii. depositing a layer of said dielectric material on top of said layer of metal; and iii. using a single mask, etching said layer of dielectric material and said layer of metal so as to form said first metal plate.

14. A method according to claim 1, further including the step of depositing an etch stop layer on said first metal plate and said dielectric material before said step d.

15. A method according to claim 1, further including the step of planarizing said metal after said step e.

* * * * *